United States Patent
Chang et al.

(10) Patent No.: US 8,592,031 B2
(45) Date of Patent: Nov. 26, 2013

(54) COATED ARTICLE AND METHOD FOR MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Nan Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 177 days.

(21) Appl. No.: 13/169,701

(22) Filed: Jun. 27, 2011

(65) Prior Publication Data

US 2012/0148866 A1 Jun. 14, 2012

(30) Foreign Application Priority Data

Dec. 13, 2010 (CN) .......................... 2010 1 0584978

(51) Int. Cl.
*B32B 9/00* (2006.01)

(52) U.S. Cl.
USPC ............ 428/336; 428/697; 428/698; 428/699

(58) Field of Classification Search
USPC .................. 428/336, 697, 698, 699
See application file for complete search history.

(56) References Cited

U.S. PATENT DOCUMENTS

| 6,586,122 B2 * | 7/2003 | Ishikawa et al. .............. 428/698 |
| 7,758,974 B2 * | 7/2010 | Yamamoto et al. ........... 428/697 |

FOREIGN PATENT DOCUMENTS

| JP | 2002-266697 | * | 9/2002 |
| JP | 2003-025113 | * | 1/2003 |
| JP | 2005-186184 | * | 7/2005 |

* cited by examiner

*Primary Examiner* — Archene Turner
(74) *Attorney, Agent, or Firm* — Altis Law Group, Inc.

(57) ABSTRACT

A coated article is described. The coated article includes a metal substrate and a hard coating formed on the substrate. The hard coating is a chromium nitride-silicon nitride compound layer. A method for applying the hard coating to the metal substrate is also described.

6 Claims, 2 Drawing Sheets

COATED ARTICLE AND METHOD FOR MAKING THE SAME

BACKGROUND

1. Technical Field

The present disclosure relates to articles which are coated, particularly to a coated article having an excellent hardness, and a method for coating the article.

2. Description of Related Art

Hard coatings are usually applied to tools (such as cutters or molds) to protect the tools and enhance their lifetime and quality. The hard coatings are intended to prevent the tool from wearing out prematurely and to provide chemical inertness to the surface of the tool. The most common hard coatings are based on transition metal nitrides (TiN or CrN), but there has been a vast increase in multi-component coatings (TiAlN), and in multilayer coatings (TiN/TiAlN) as well as in carbon-based coatings (DLC). However, such coatings as these may not achieve a worthwhile standard in reducing wear, and articles so coated may reveal unacceptably low levels of abrasion resistance and/or corrosion resistance.

Therefore, there is room for improvement within the art.

BRIEF DESCRIPTION OF THE FIGURES

Many aspects of this disclosure can be better understood with reference to the following figures. The components in the figure are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
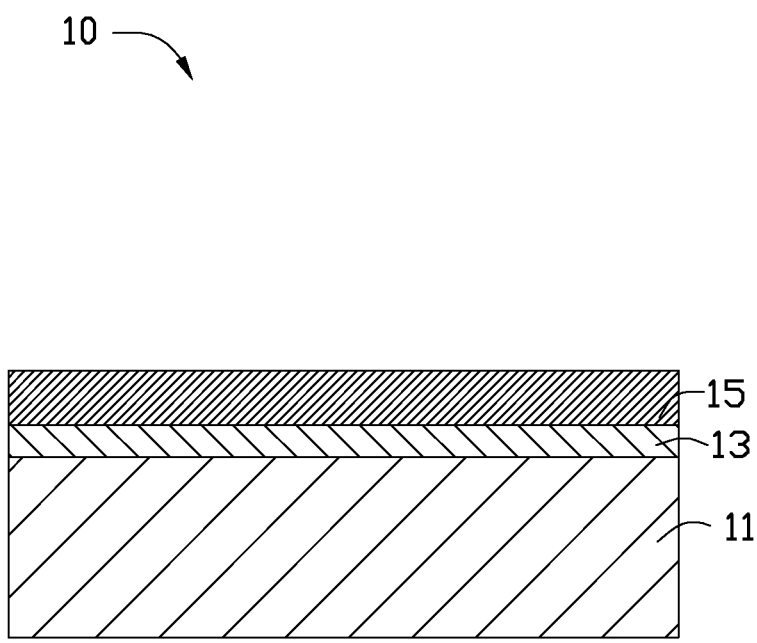
FIG. 1 is a cross-sectional view of an exemplary embodiment of a coated article.

FIG. 1 shows a coated article 10 according to an exemplary embodiment. The coated article 10 includes a metal substrate 11, a chromium transition coating 13 formed on a surface of the substrate 11, and a hard coating 15 formed on the chromium transition coating 13.

The metal substrate 11 may be made of aluminum, aluminum alloy, magnesium, magnesium alloy, stainless steel, or any hard-alloy.

The chromium transition coating 13 may be formed by vacuum sputtering and has a thickness of about 200 nm-400 nm. The chromium transition coating 13 enhances the bonding of the hard coating 15 to the metal substrate 11.

The hard coating 15 is a chromium nitride (CrN)-silicon nitride (SiN) compound layer formed by vacuum sputtering. The chromium within the CrN—SiN compound may have an atomic percentage of about 10%-15%. The silicon within the CrN—SiN compound may have an atomic percentage of about 30%-40%. The nitrogen within the CrN—SiN compound may have an atomic percentage of about 45%-60%. The hard coating 15 may have a thickness of about 0.8 μm-1.5 μm.

The CrN—SiN compound includes mainly SiN phase. The SiN phase has a non-crystalline structure, which provides extreme hardness to the hard coating 15. The CrN phase within the CrN—SiN compound is crystalline and has crystalline grains formed therein. The CrN crystalline grains embed evenly in the SiN phase, which creates a dislocation movement to the SiN phase. Such a dislocation movement further improves the hardness and abrasion resistance of the hard coating 15.

Additionally, the embedded CrN crystalline grains will block pinholes or cracks in the hard coating 15, thus, corrosive substances will be prevented from entering the hard coating 15 and galvanic corrosion is nullified in the coated article 10. Thus, the coated article 10 has good corrosion resistance.

A method for making the coated article 10 may include the following steps:

The substrate 11 is pre-treated, such pre-treating process may include the following steps:

The substrate 11 is cleaned in an ultrasonic cleaning device (not shown) filled with ethanol or acetone.

Figure 2:
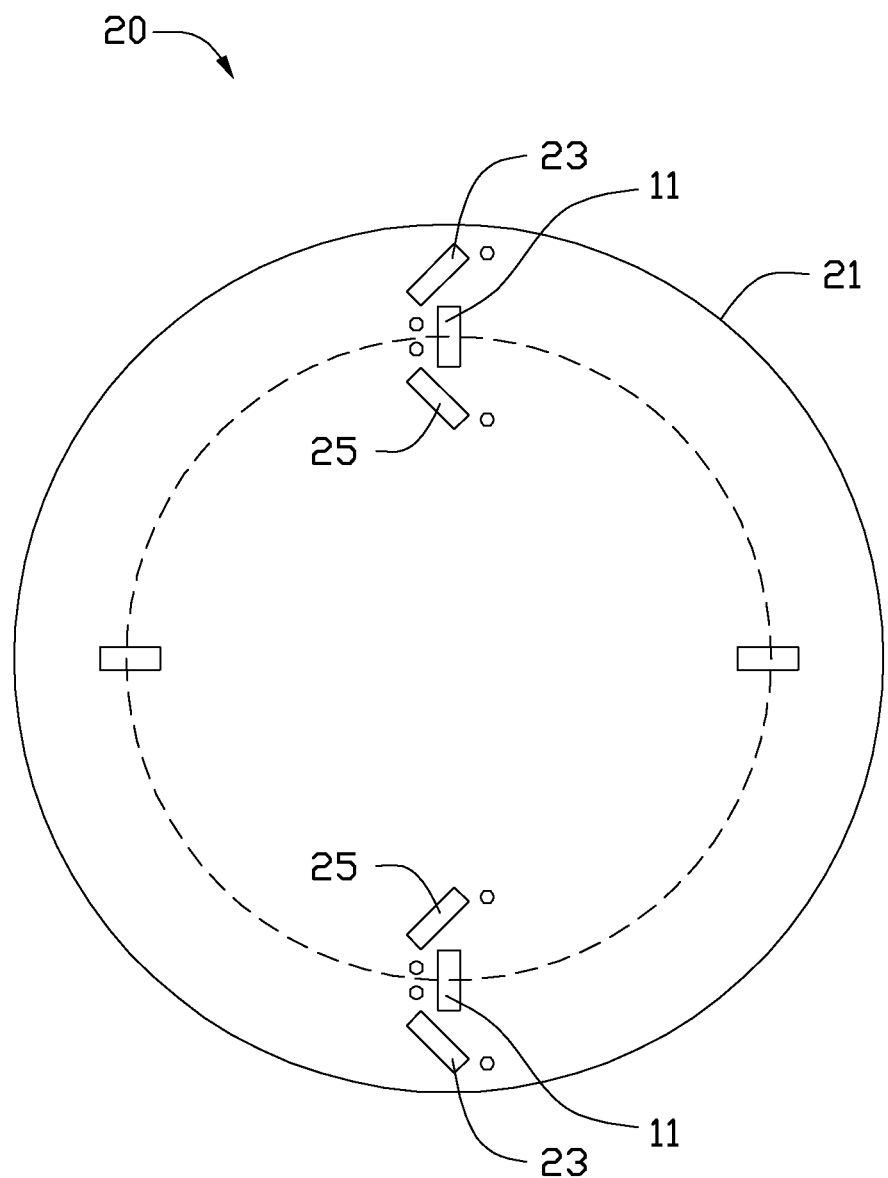
FIG. 2 is an overview of an exemplary embodiment of a vacuum sputtering device.

The substrate 11 is then plasma cleaned. Referring to FIG. 2, the substrate 11 may be positioned in a coating chamber 21 of a vacuum sputtering device 20. The coating chamber 21 is fixed with chromium targets 23 and silicon targets 25 therein. Air is then evacuated from the coating chamber 21 to about $8.0 \times 10^{-3}$ Pa. Argon gas of a purity of about 99.999% may be used as a working gas, and is injected into the coating chamber 21 at a flow rate of about 150 standard-state cubic centimeters per minute (sccm) to 300 sccm. The substrate 11 may be biased with a negative bias voltage of between −300 V and −500 V, then a high-frequency voltage is produced in the coating chamber 21 and the argon gas is ionized. The argon plasma then strikes the surface of the substrate 11 to clean the surface of the substrate 11. Plasma cleaning of the substrate 11 may take between 5 and 10 minutes (min). The plasma cleaning process enhances the bond between the substrate 11 and the chromium transition coating 13. The chromium and silicon targets are unaffected by the pre-cleaning process.

The chromium transition coating 13 may be magnetron sputtered on the pre-treated substrate 11. Magnetron sputtering of the chromium transition coating 13 is implemented in the coating chamber 21. The temperature of the interior of the coating chamber 21 may be between 20° C. and 120° C. Argon gas may be used as a working gas and is injected into the coating chamber 21 at a flow rate of about 150 sccm-300 sccm. Between 1 kilowatt (KW) and 2 KW of electric power is then applied to the chromium targets 23 to achieve deposition of the chromium on the substrate 11. During the deposition process, the substrate 11 may be biased with a negative bias voltage of between −150 V and −500 V. The depositing of the chromium transition coating 13 may take between 20 and 30 minutes.

The hard coating 15 may be magnetron sputtered onto the chromium transition coating 13. The magnetron sputtering of the hard coating 15 is implemented in the coating chamber 21. The temperature of the interior of the coating chamber 21 may be between 20° C. and 120° C. Nitrogen ($N_2$) may be used as a reaction gas and is injected into the coating chamber 21 at a flow rate of about 40 sccm-60 sccm. Argon gas may be used as a working gas and is injected into the coating chamber 21 at a flow rate of about 150 sccm-300 sccm. The $N_2$ in the coating chamber 21 may have a partial pressure ratio of between 20% and 40%. Between 1 KW and 7 KW of electric power is then applied to the chromium targets 23, and between 10 and 12 KW of electric power at a radio frequency is applied to the silicon targets 25, thus chromium and silicon atoms are sputtered off from the chromium targets 23 and the silicon targets 25. The chromium atoms, silicon atoms, nitrogen atoms, and argon atoms impact with each other at the electric field in the coating chamber 21, and are then ionized. The ionized chromium and silicon then chemically react with the ionized nitrogen and form the hard coating 15 on the chromium transition coating 13. During the depositing process, the substrate 11 may be biased with a negative bias voltage of between −150 V and −500 V. The deposition of the hard coating 15 may take between 60 and 80 minutes.

During the depositing of the hard coating 15, the amount of power applied to the silicon targets 25 is more than the power applied to the chromium targets 23, so the number of silicon atoms sputtered off from the silicon targets 25 greatly exceeds the number of the chromium atoms. The ionized $N_2$ mostly reacts with the ionized silicon and is the main reason for the SiN phase forming in the hard coating 15. The greater quantity of the silicon atoms prevents the ionized silicon crystallizing with the ionized nitrogen during the formation of the SiN phase, so the SiN phase has a non-crystalline structure. Furthermore, the chromium targets 23 and the silicon targets 25 sputter together, which greatly increases the quantity of atoms in the coating chamber 21, the increased number of atoms improve the ionization of these atoms. The improved ionization of the atoms results in a more even embedding of the CrN crystalline grains in the SiN phase, which further improve the hardness and abrasion resistance properties of the hard coating 15.

Specific examples of coating articles are described as follows. The ultrasonic cleaning in these specific examples may be substantially the same as described above, so it is not described here again. Additionally, the processes of magnetron sputtering the chromium transition coating 13 and the hard coating 15 in the specific examples is substantially the same as described above, and the specific examples merely emphasize the different parameters in the different processes of making the coated article 10.

EXAMPLE 1

Plasma cleaning the metal substrate 11: the flow rate of argon (Ar) is 280 sccm; the metal substrate 11 has a negative bias voltage of −300 V; plasma cleaning of the metal substrate 11 takes 9 min.

Sputtering to form a chromium transition coating 13 on the substrate 11: the flow rate of Ar is 280 sccm; the metal substrate 11 has a negative bias voltage of −450 V; the chromium targets 23 are subjected to electrical power at a level of 1.8 KW; the temperature inside of the coating chamber 21 is 100° C.; the sputtering of the chromium transition coating 13 takes 28 min; the chromium transition coating 13 has a thickness of 370 nm.

Sputtering to form the hard coating 15 on the chromium transition coating 13: the flow rate of Ar is 280 sccm, the flow rate of $N_2$ is 55 sccm; the metal substrate 11 has a negative bias voltage of −450 V; the chromium targets 23 are subjected to electrical power at a level of 1.8 KW, the silicon targets 25 are subjected to electrical power at a radio frequency and at a level of 12 KW; the temperature inside the coating chamber 21 is 100° C.; the sputtering of the hard coating 15 takes 75 min; the hard coating 15 has a thickness of 1.3 μm; the chromium contained in the hard coating 15 has an atomic percentage of about 14%; the silicon contained in the hard coating 15 has an atomic percentage of about 40%; the nitrogen contained in the hard coating 15 has an atomic percentage of about 46%.

EXAMPLE 2

Plasma cleaning the metal substrate 11: the flow rate of Ar is 230 sccm; the metal substrate 11 has a negative bias voltage of −480 V; the plasma cleaning of the metal substrate 11 takes 7 min.

Sputtering to form a chromium transition coating 13 on the metal substrate 11: the flow rate of Ar is 230 sccm; the metal substrate 11 has a negative bias voltage of −230 V; the chromium targets 23 are subjected to electrical power at a level of 1.5 KW; the temperature inside the coating chamber 21 is 70° C.; the sputtering of the chromium transition coating 13 takes 25 min; the chromium transition coating 13 has a thickness of 280 nm.

Sputtering to form a hard coating 15 on the chromium transition coating 13: the flow rate of Ar is 230 sccm, the flow rate of $N_2$ is 50 sccm; the metal substrate 11 has a negative bias voltage of −230 V; the chromium targets 23 are subjected to electrical power at a level of 1.5 KW, the silicon targets 25 are subjected to electrical power at a radio frequency and at a level of 11 KW; the temperature inside the coating chamber 21 is 70° C.; the sputtering of the hard coating 15 takes 70 min; the hard coating 15 has a thickness of 1.1 μm; the chromium contained in the hard coating 15 has an atomic percentage of about 13%; the silicon contained in the hard coating 15 has an atomic percentage of about 37%; the nitrogen contained in the hard coating 15 has an atomic percentage of about 50%.

EXAMPLE 3

Plasma cleaning the metal substrate 11: the flow rate of Ar is 160 sccm; the metal substrate 11 has a negative bias voltage of −400 V; the plasma cleaning of the metal substrate 11 takes 6 min.

Sputtering to form a chromium transition coating 13 on the metal substrate 11: the flow rate of Ar is 160 sccm; the metal substrate 11 has a negative bias voltage of −160 V; the chromium targets 23 are subjected to an electrical power at a level of 1.2 KW; the temperature inside the coating chamber 21 is 30° C.; the sputtering of the chromium transition coating 13 takes 22 min; the chromium transition coating 13 has a thickness of 220 nm.

Sputtering to form a hard coating 15 on the chromium transition coating 13: the flow rate of Ar is 160 sccm, the flow rate of $N_2$ is 42 sccm; the metal substrate 11 has a negative bias voltage of −160 V; the chromium targets 23 are subjected to an electrical power at a level of 1.2 KW, the silicon targets 25 are subjected to an electrical power at a radio frequency and at a level of 10 KW; the temperature inside the coating chamber 21 is 30° C.; the sputtering of the hard coating 15 takes 65 min; the hard coating 15 has a thickness of 0.9 μm; the chromium contained in the hard coating 15 has an atomic percentage of about 13%; the silicon contained in the hard coating 15 has an atomic percentage of about 38%; the nitrogen contained in the hard coating 15 has an atomic percentage of about 49%.

It is believed that the exemplary embodiment and its advantages will be understood from the foregoing description, and various changes may be made thereto without departing from the spirit and scope of the disclosure or sacrificing all of its advantages, the examples hereinbefore described merely being preferred or exemplary embodiments of the disclosure.

What is claimed is:

1. A coated article, comprising:
   a metal substrate; and
   a hard coating formed on the metal substrate, the hard coating being a chromium nitride-silicon nitride compound layer;
   wherein the chromium nitride-silicon nitride compound comprises silicon nitride phase and chromium nitride phase, the silicon nitride phase has a non-crystalline structure, the chromium nitride phase is crystalline and has chromium nitride crystalline grains formed therein, the chromium nitride crystalline grains embed in the silicon nitride phase.

2. The coated article as claimed in claim 1, wherein chromium, silicon, and nitrogen contained in the chromium nitride-silicon nitride compound layer have an atomic percentage of about 10%-15%, 30%-40%, and 45%-60% respectively.

3. The coated article as claimed in claim 1, wherein the hard coating has a thickness of about 0.8 μm-1.5 μm.

4. The coated article as claimed in claim 1, further comprising a chromium transition coating formed between the substrate and the hard coating.

5. The coated article as claimed in claim 4, wherein the chromium transition coating has a thickness of about 200 nm-400 nm.

6. The coated article as claimed in claim 1, wherein the metal substrate is made of aluminum, aluminum alloy, magnesium, magnesium alloy, stainless steel, or hard-alloy.

* * * * *